(12) United States Patent
Thomas

(10) Patent No.: US 12,323,109 B2
(45) Date of Patent: Jun. 3, 2025

(54) LOW-HEADROOM DYNAMIC BASE CURRENT CANCELLATION TECHNIQUES

(71) Applicant: Analog Devices, Inc., Wilmington, MA (US)

(72) Inventor: Andrew Joseph Thomas, Arlington, MA (US)

(73) Assignee: Analog Devices, Inc., Wilmington, MA (US)

( * ) Notice: Subject to any disclaimer, the term of this patent is extended or adjusted under 35 U.S.C. 154(b) by 527 days.

(21) Appl. No.: 17/586,391

(22) Filed: Jan. 27, 2022

(65) Prior Publication Data

US 2023/0238922 A1  Jul. 27, 2023

(51) Int. Cl.
| | | |
|---|---|---|
| H03F 3/45 | (2006.01) |
| H03F 1/26 | (2006.01) |
| H03F 1/32 | (2006.01) |
| H03F 1/56 | (2006.01) |

(52) U.S. Cl.
CPC ............. *H03F 1/3211* (2013.01); *H03F 1/26* (2013.01); *H03F 1/56* (2013.01); *H03F 3/4508* (2013.01)

(58) Field of Classification Search
CPC . H03F 1/3211; H03F 1/26; H03F 1/56; H03F 3/4508; H03F 1/14; H03F 3/45089; H03F 3/45085
USPC .................................................. 330/252–261
See application file for complete search history.

(56) References Cited

U.S. PATENT DOCUMENTS

| | | |
|---|---|---|
| 4,843,342 A | 6/1989 | Hester et al. |
| 6,788,143 B1 | 9/2004 | Chen |
| 6,885,220 B2 | 4/2005 | Engl |
| 6,965,267 B2 | 11/2005 | Delorme et al. |
| 7,068,106 B2 | 6/2006 | Harvey |
| 7,245,162 B1 | 7/2007 | Betts |
| 7,253,686 B2 | 8/2007 | Ali |
| 7,411,451 B2 | 8/2008 | Alenin et al. |
| 8,130,037 B2 | 3/2012 | Bowers |
| 8,680,922 B2 * | 3/2014 | Wan ..................... H03K 5/2445 330/253 |
| 8,970,301 B2 | 3/2015 | Johnson et al. |
| 9,661,695 B1 | 5/2017 | Cai et al. |
| 10,992,271 B2 | 4/2021 | Singh |
| 2004/0104775 A1 | 6/2004 | Seremeta |

FOREIGN PATENT DOCUMENTS

| | | |
|---|---|---|
| EP | 0762629 | 3/1997 |
| JP | 5377676 | 10/2013 |
| JP | 6000884 | 9/2016 |
| JP | 2017184122 | 10/2017 |

* cited by examiner

*Primary Examiner* — Andrea Lindgren Baltzell
*Assistant Examiner* — Khiem D Nguyen
(74) *Attorney, Agent, or Firm* — Schwegman Lundberg & Woessner, P.A.

(57) ABSTRACT

Circuit techniques for providing base-current cancellation of a bipolar junction transistor (BJT) differential pair that compensate for tail current noise and differential voltage transients without penalizing supply headroom.

20 Claims, 5 Drawing Sheets

LOW-HEADROOM DYNAMIC BASE CURRENT CANCELLATION TECHNIQUES

FIELD OF THE DISCLOSURE

This document pertains generally, but not by way of limitation, to electronic amplifier circuits and more specifically to bias current cancellation circuits.

BACKGROUND

Ideally, no current flows into the input terminal of an amplifier. In practice, however, there is an input bias current for each half of a differential pair of transistors of the amplifier. These input bias currents multiplied by the external impedance associated with the signal driving the input causes a voltage that is an error voltage between the actual signal and the signal received by the amplifier. Compensating for the input bias current can reduce this error voltage.

SUMMARY OF THE DISCLOSURE

This disclosure describes, among other things, various circuit techniques for providing base-current cancellation of a bipolar junction transistor (BJT) differential pair that compensate for tail current noise and differential voltage transients without penalizing supply headroom.

In some aspects, this disclosure is directed to a circuit having first and second inputs to receive corresponding first and second input signals, the circuit comprising: a first differential transistor pair including first and second input transistors, wherein the first and second input transistors are configured to receive the first and second input signals, respectively, and wherein an emitter of the first input transistor is coupled to an emitter of the second input transistor; and a cancellation circuit configured to reduce or cancel a variation in corresponding input bias current received at the first and second inputs due to input transient voltages, the cancellation circuit comprising: a cascode transistor circuit including a cascode transistor configured to provide a tail current of the first differential transistor pair; and a second differential transistor pair including third and fourth transistors, wherein the third and fourth transistors are configured to: receive representations of the first and second input signals; and split a bias current of the cascode transistor into two currents according to the received representations of the first and second input signals, wherein the cancellation circuit is configured to provide currents corresponding to the two currents to the first and second inputs.

In some aspects, this disclosure is directed to a method of compensating a circuit, the circuit having first and second inputs to receive corresponding first and second input signals, the method comprising: coupling first and second input transistors to form a first differential transistor pair; coupling an emitter of the first input transistor to an emitter of the second input transistor; receiving, using the first and second input transistors, the first and second input signals, respectively; and reducing or canceling a variation in corresponding input bias current received at the first and second inputs due to input transient voltages by: providing, by a cascode transistor, a tail current of the first differential transistor pair; receiving, by a second differential transistor pair, representations of the first and second input signals; splitting, by the second differential transistor pair, a bias current of a cascode transistor into two currents according to the received representations of the first and second input signals; and providing currents corresponding to the two currents to the first and second inputs.

In some aspects, this disclosure is directed to a circuit having first and second inputs to receive corresponding first and second input signals, the circuit comprising: a first differential transistor pair including first and second input transistors, wherein the first and second input transistors are configured to receive the first and second input signals, respectively, and wherein an emitter of the first input transistor is coupled to an emitter of the second input transistor; and a cancellation circuit configured to reduce or cancel a variation in corresponding input bias current received at first and second input inputs due to input transient voltages, the cancellation circuit comprising: a cascode transistor circuit including a cascode second transistor pair including third and fourth transistors configured to provide at least a portion of a tail current of the first differential transistor pair, wherein the third and fourth transistors are configured to split the tail current into two currents; and buffer circuitry configured to receive the first and second input signals, and wherein the buffer circuitry is configured to provide representations of the first and second input signals to the third and fourth transistors, wherein the cancellation circuit is configured to provide currents corresponding to the two currents to the first and second input inputs.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

This disclosure describes various circuit techniques for providing base-current cancellation of a bipolar junction transistor (BJT) differential pair that compensate for tail current noise and differential voltage transients without penalizing supply headroom.

Figure 1:
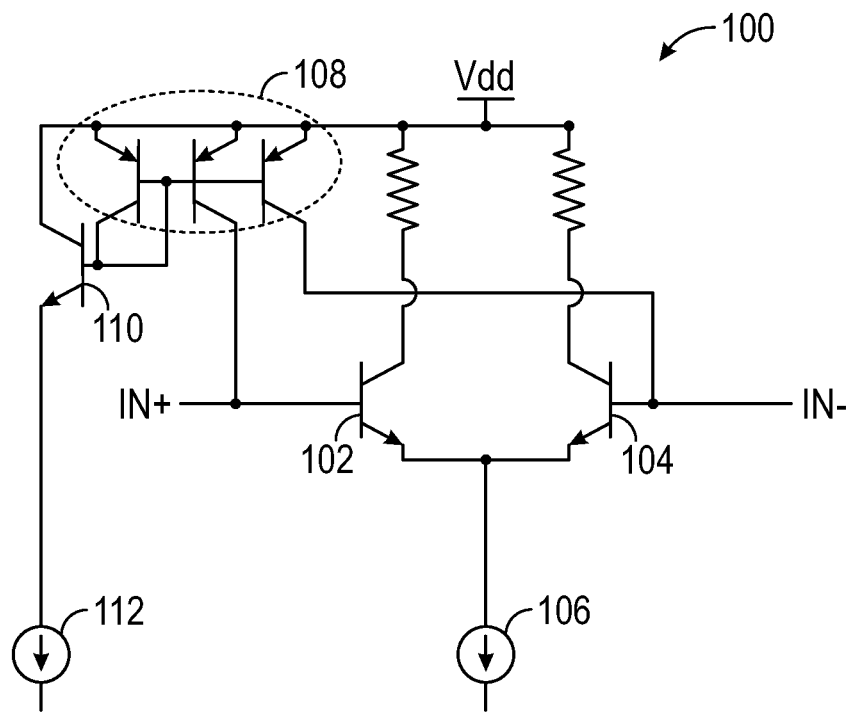
FIG. 1 is an example of an existing amplifier circuit for providing base-current cancellation of a bipolar junction transistor (BJT) differential pair.

FIG. 1 is an example of an existing amplifier circuit for providing base-current cancellation of a bipolar junction transistor (BJT) differential pair. The circuit 100 includes a resistively-loaded BJT differential transistor pair having transistors 102, 104 that are configured to receive input signals at input nodes IN+ and IN−, respectively. The circuit 100 includes a current source 106 coupled to the emitters of the transistors 102, 104. The circuit 100 further includes a multiple-output current mirror 108 and a replica transistor 110 coupled to a current source 112, where the replica transistor 110 is used to replicate the base currents into the transistors 102, 104.

The circuit 100 of FIG. 1, along with other similar circuits, requires little supply headroom, but can consume substantial extra power due to the use of the replica transistor 110 to measure base current. The circuit 100 can also suffer degraded accuracy/noise because it requires a match between the two current sources 106, 112, which can be worsened if the replica transistor 110 is smaller than the transistors 102, 104 in the main path to reduce the power penalty. Additionally, the circuit 100 fails to compensate for transient variations in the input bias current, whether due to the noise of the tail current, or due to transient voltage excursions of the differential pair steering the tail current.

Figure 2:
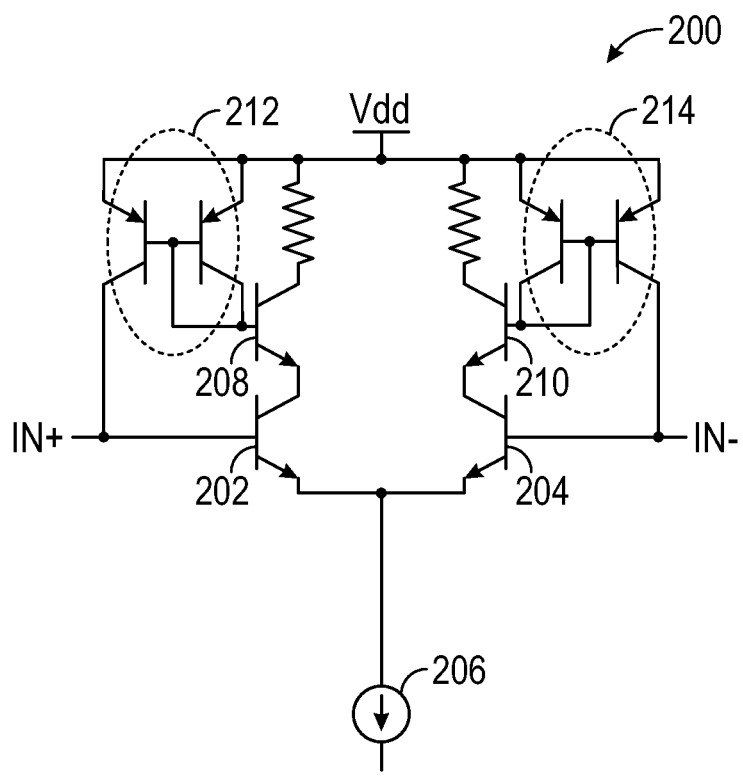
FIG. 2 is another example of an existing amplifier circuit for providing base-current cancellation of a bipolar junction transistor (BJT) differential pair.

FIG. 2 is another example of an existing amplifier circuit for providing base-current cancellation of a bipolar junction transistor (BJT) differential pair. The circuit 200 includes a resistively-loaded BJT differential transistor pair having transistors 202, 204 that are configured to receive input signals at input nodes IN+ and IN−, respectively. The circuit 200 includes a current source 206 coupled to the emitters of the transistors 202, 204. The circuit 200 includes two cascode transistors 208, 210 coupled to the collectors of the transistor 202, 204, respectively. A first current mirror circuit 212 is coupled to the base of the cascode transistor 208 and a second current mirror circuit 214 is coupled to the base of the cascode transistor 210.

The cascode transistors 208, 210 each have an emitter current that is the collector current of the main path from the resistors to the transistors 202, 204 of the differential transistor pair. If the collector currents of the transistors 202, 204 of the differential pair change due to input transients, the base current of the transistors 202, 204 of the differential pair will change. The base currents of the transistors 208, 210 will change by approximately the same amount and the current mirror circuits 212, 214 will experience the transient.

Because the circuit 200 uses the collector current of the main transistors 202, 204, no additional power is required, and the base current cancellation tracks the actual transients of the main base currents well (neglecting a $$\frac{1}{\beta^2}$$

term). The circuit 200 also provides cascoding of the input differential pair, which can be desirable. However, the cascoding can substantially impact how close the IN+ and IN− nodes can operate to the positive supply.

Figure 3:
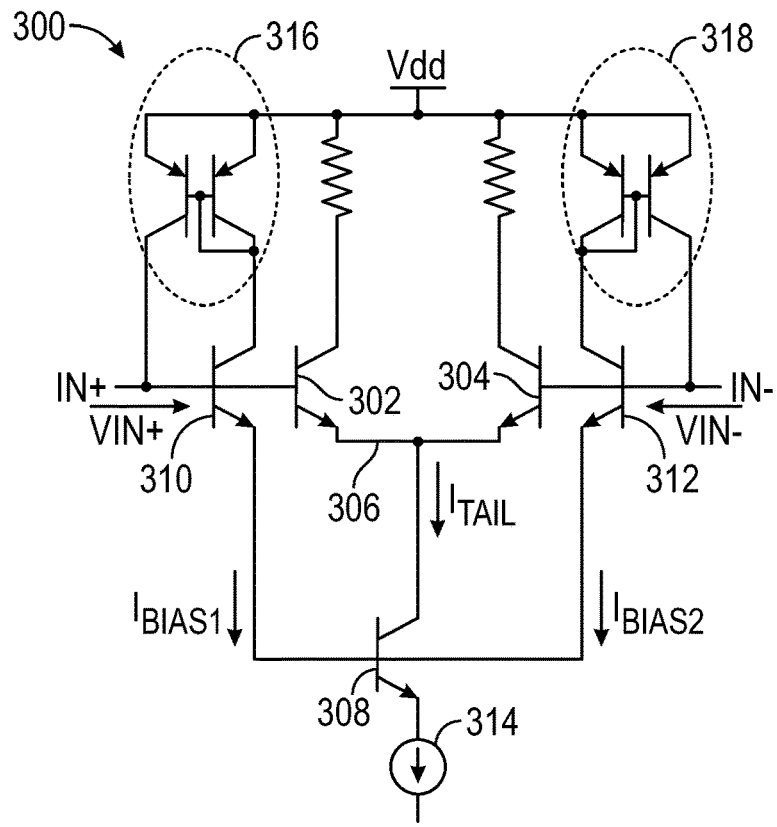
FIG. 3 is an example of a circuit that can provide transient cancellation and input bias current cancellation using various techniques of this disclosure.

FIG. 3 is an example of a circuit that can provide transient cancellation and input bias current cancellation using various techniques of this disclosure. The circuit 300 includes a resistively-loaded first differential transistor pair having a first input transistor 302 configured to receive a first input signal VIN+ at a first input node IN+ and a second input transistor 304 configured to receive a second input signal VIN− at a second input node IN−. An emitter of the first input transistor 302 is coupled to an emitter of the second input transistor 304 at node 306.

The circuit 300 includes a cancellation circuit configured to reduce or cancel a variation in corresponding input bias current received at the first and second input nodes IN+, IN− due to input transient voltages. The cancellation circuit can include a cascode transistor circuit including a cascode transistor 308 configured to provide a tail current $I_{TAIL}$ of the first differential transistor pair. Moving the cascode transistor 308 into the tail current path and out of the collectors of the main transistors 302, 304 (like in FIG. 2), can restore the ability of the first (or main) differential transistor pair to operate as close as possible to the voltage supply rail VDD, thereby providing a low-headroom cancellation solution.

The cancellation circuit can further include a second differential transistor pair including a third transistor 310 and a fourth transistor 312. The circuit 300 achieves transient tracking by inserting the cascode transistor 308 in the tail current path, and then splitting its base current using the replica differential transistor pair 310, 312, which duplicates the hyperbolic tangent function tanh( ) of the main differential transistor pair including the transistors 302, 304.

The transistors 310, 312 function as a differential pair with the same differential voltage as the main differential transistor pair 302, 304 and a tail current of the cascode transistor's base current, so the collector currents of the third and fourth transistors 310, 312 are approximately the same as the base currents of the main differential transistor pair 302, 304 (assuming f is large). Any changes to the base currents in the main differential transistor pair 302, 304 cause a change in the collector currents in the corresponding third and fourth transistors 310, 312, which is then mirrored through a corresponding current mirror circuit (described below) and applied to the first and second input nodes IN+, IN− to provide the desired cancellation.

The third transistor 310 and the fourth transistor 312 are configured to receive representations of the first and second input signals VIN+, VIN−, respectively. In addition, the third transistor 310 and the fourth transistor 312 are configured to split a bias current of the cascode transistor 308 into two currents $I_{BIAS1}$ and $I_{BIAS2}$, according to the received representations of the first and second input signals VIN+, VIN−. The cancellation circuit is configured to provide currents corresponding to the two currents $I_{BIAS1}$ and $I_{BIAS2}$ to the first and second input nodes IN+, IN−.

In some examples, the cascode transistor 308 includes a collector coupled to the emitters of the first and second input transistors 302, 304. A base of the third transistor 310 can be coupled to a base of the first input transistor 302, and a base of the fourth transistor 312 can be coupled to a base of the second input transistor 304. An emitter of the third transistor 310 can be coupled to a base of the cascode transistor 308, and an emitter of the fourth transistor 312 can be coupled to the base of the cascode transistor 308. The circuit 300 can include a current source 314 coupled to at least one emitter of the cascode transistor circuit, such as the emitter of the cascode transistor 308.

In some examples, the circuit 300 can include a first current mirror circuit 316 coupled to a collector of the third transistor 310 and a second current mirror circuit 318 coupled to a collector of the fourth transistor 312. The third transistor 310 and the fourth transistor 312 can act as replicas of the first input transistor 302 and the second input transistor 304. As such, the replica collectors are mirrored, giving near-zero total input bias current, regardless of voltage.

The circuit 300 can also suppresses "balanced" input current noise, which is due to the noise of the tail current. The first current mirror circuit 316 and the second current mirror circuit 318 can provide the currents corresponding to the two currents $I_{BIAS1}$ and $I_{BIAS2}$ to the first and second input nodes IN+, IN−. In this manner, the base currents of the transistors 302, 304 can be subtracted at the input nodes IN+, IN−.

The circuit 300 of FIG. 3 exploits the fact that the current splitting that occurs in the main differential transistor pair 302, 304 is a predictable and known hyperbolic tangent function of the input voltage. The second differential transistor pair including the third transistor 310 and the fourth transistor 312 provides the current splitting but operates on the base current. Because the base current is related to the collector current ($I_C = \beta I_B$), the hyperbolic tangent function can be applied either before or after the current is split. An explanation of the bias-current cancellation using the hyperbolic tangent function is presented below with respect to FIG. 5.

In the circuit 200 of FIG. 2, the main differential transistor pair 202, 204 splits the current and then the circuit determines the base current using a replica transistor. In contrast, the circuit 300 does not split the current. Instead, the base current division is performed immediately and then the hyperbolic tangent function is applied afterward.

Figure 4:
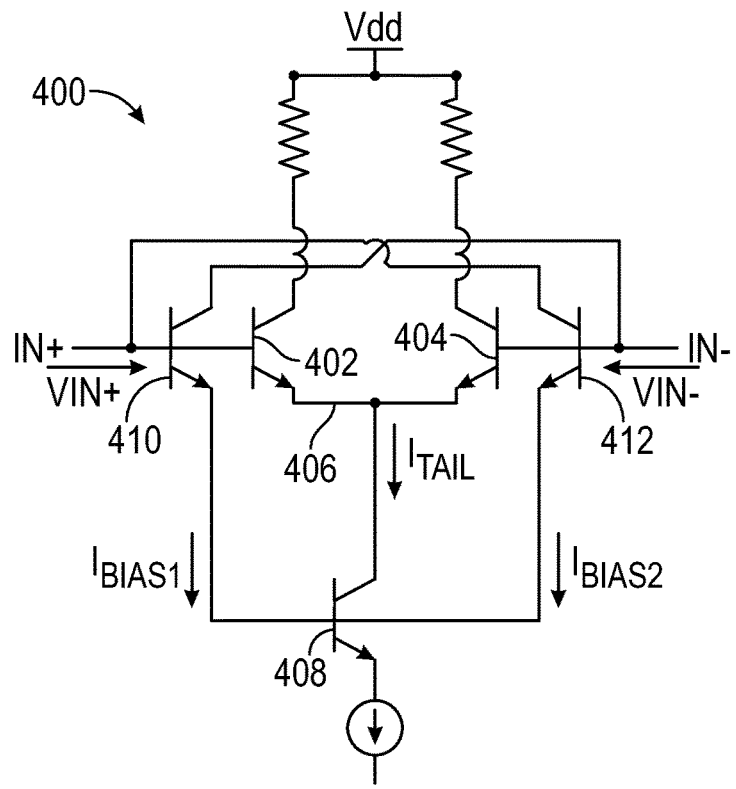
FIG. 4 is another example of a circuit that can provide transient cancellation using various techniques of this disclosure.

There are two aspects to the cancellation in FIG. 3 (and FIG. 4). First, the first and second input transistors 302, 304 are operating at some level of bias current and, for cancellation purposes, the cancellation circuit can determine the static base current for a transistor operating at that bias level. The cascode transistor circuit can be used for this determination. Second, because of input voltage transients, this bias current is not static and divides in some way due to the voltage difference between the input nodes IN+, IN−, which causes the base currents of the first and second input transistors 302, 304 to be divided in a similar manner. The third and fourth transistors 310, 312 are used to determine how the current is divided. In this manner, the cascode transistor circuit and the third and fourth transistors 310, 312 can be used to determine and cancel the input bias current and any transients.

FIG. 4 is another example of a circuit that can provide transient cancellation using various techniques of this disclosure. The circuit 400 includes a resistively-loaded first differential transistor pair having a first input transistor 402 configured to receive a first input signal VIN+ at a first input node and a second input transistor 404 configured to receive a second input signal VIN− at a second input node IN−. An emitter of the first input transistor 402 is coupled to an emitter of the second input transistor 404 at node 406.

The circuit 400 includes a cancellation circuit configured to reduce or cancel a variation in corresponding input bias current received at the first and second input nodes IN+, IN− due to input transient voltages. The cancellation circuit can include a cascode transistor circuit including a cascode transistor 408 configured to provide a tail current $I_{TAIL}$ of the first differential transistor pair. Moving the cascode transistor 408 into the tail current path and out of the collectors of the main transistors 402, 404 (like in FIG. 2), can restore the ability of the first (or main) differential transistor pair to operate as close to the voltage supply rail VDD as possible.

The cancellation circuit can further include a second differential transistor pair including a third transistor 410 and a fourth transistor 412. Like the circuit 300 of FIG. 3, the circuit 400 achieves transient tracking by inserting the cascode transistor 408 in the tail current path, and then splitting its base current using the replica differential transistor pair 410, 412, which duplicates the hyperbolic tangent function of the main differential transistor pair 402, 404. The transistors 410, 412 function as a differential pair with the same differential voltage as the main differential transistor pair 402, 404 and a tail current of the cascode transistor's base current, so the collector currents are approximately the same as the base currents of the main differential transistor pair 402, 404 (assuming β is large).

The third transistor 410 and the fourth transistor 412 are configured to receive representations of the first and second input signals IN+, VIN−, respectively. In addition, the third transistor 410 and the fourth transistor 412 are configured to split a bias current of the cascode transistor 408 into two currents $I_{BIAS1}$ and $I_{BIAS2}$, according to the received representations of the first and second input signals VIN+, VIN−. The cancellation circuit is configured to provide currents corresponding to the two currents $I_{BIAS1}$ and $I_{BIAS2}$ to the first and second input nodes IN+, IN−.

Rather than include current mirror circuits, like in FIG. 3, the circuit 400 couples a collector of the third transistor 410 to the second input node IN−, and couples a collector of the fourth transistor 412 to the first input IN+. In this manner, rather than subtracting the base current for input bias current cancellation, like in FIG. 3, the circuit 400 can swap the current differentially and then add them, which is equivalent from a transient perspective. Although the circuit 400 uses fewer components and has fewer design requirements than the circuit 300 of FIG. 3, the circuit 400 does not provide near-zero total bias current as in FIG. 3.

Figure 5:
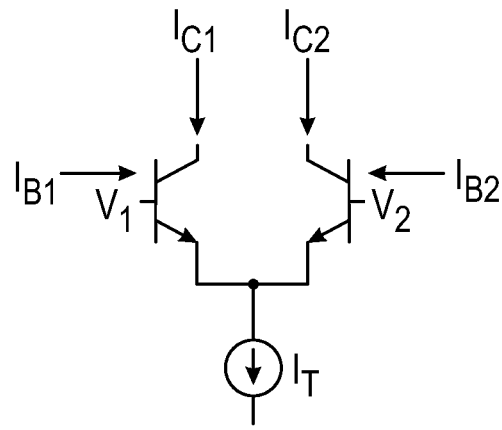
FIG. 5 is a schematic diagram of an NPN differential transistor pair.

FIG. 5 is a schematic diagram of an NPN differential transistor pair. The math behind the bias-current cancellation using the hyperbolic tangent function is explained below with respect to FIG. 5. The collector and base currents of the NPN differential transistor pair in FIG. 5 have the following well-known relationship to the tail current $I_T$ and the input voltages $V_1$ and $V_2$:

$$I_{C1} = \frac{\beta}{\beta+1} I_T \tanh\left(\frac{V_1 - V_2}{V_T}\right) \quad \text{Equation 1}$$

$$I_{B1} = \frac{1}{\beta+1} I_T \tanh\left(\frac{V_1 - V_2}{V_T}\right) \quad \text{Equation 2}$$

$$I_{C2} = \frac{\beta}{\beta+1} I_T \tanh\left(\frac{V_2 - V_1}{V_T}\right) \quad \text{Equation 3}$$

$$I_{B2} = \frac{1}{\beta+1} I_T \tanh\left(\frac{V_2 - V_1}{V_T}\right) \quad \text{Equation 4}$$

In Equations 14, $V_T$ is the thermal voltage kT/q and β is assumed to be near-constant.

The goal is to construct a current that substantially duplicates the dependences of $I_{B1}$ (and/or $I_{B2}$). In FIG. 2, this is accomplished by inserting a device whose emitter current is $I_{C1}$ so that its base current is given by the following:

$$I_B = \frac{1}{\beta+1} I_{C1} = \frac{\beta}{(\beta+1)^2} I_T \tanh\left(\frac{V_1 - V_2}{V_T}\right) \approx I_{B1} \quad \text{Equation 5}$$

This is essentially a matter of using a replica device to divide the current by β after it is split into currents $I_{C1}$ and $I_{C2}$. The techniques of this disclosure instead take the approach of interchanging the order of the replica division by β and the tan h-function splitting, which amounts to a different association in the following equation:

$$I_{B1} = \left(\frac{1}{\beta+1}I_T\right) \cdot \tanh\left(\frac{V_1-V_2}{V_T}\right) = \frac{1}{\beta+1} \cdot \left(I_T \tanh\left(\frac{V_1-V_2}{V_T}\right)\right) \quad \text{Equation 6}$$

That is, the base current of the tail-current cascode transistor is given by $$I_{BT} = \left(\frac{1}{\beta+1}I_T\right),$$

and that functions as a tail current of the auxiliary differential pair resulting in Equation 7:

$$I_{CAux1} = \frac{\beta}{\beta+1}I_{BT}\tanh\left(\frac{V_1-V_2}{V_T}\right) = \frac{\beta}{(\beta+1)^2}I_T\tanh\left(\frac{V_1-V_2}{V_T}\right) \approx I_{B1} \quad \text{Equation 7}$$

The circuit 400 of FIG. 4 exploits the fact that $I_{B1}+I_{B2} \approx I_T/\beta$ with no dependence on the input voltages, so instead of using a mirror to invert the replica base current, as in FIGS. 1 and 2 and in FIG. 5, and producing $I_{in}=I_{B1}-I_{replica} \approx 0$, the circuit 400 instead produces $I_{in}=I_{B1}+I_{CAux2} \approx I_T/\beta$.

Although different structures, e.g., field-effect transistor differential pairs, can have a different voltage-to-current behavior which does not exactly mimic the tanh( ) function of the main differential pair, they have a sufficiently similar form for some purposes.

Figure 6:
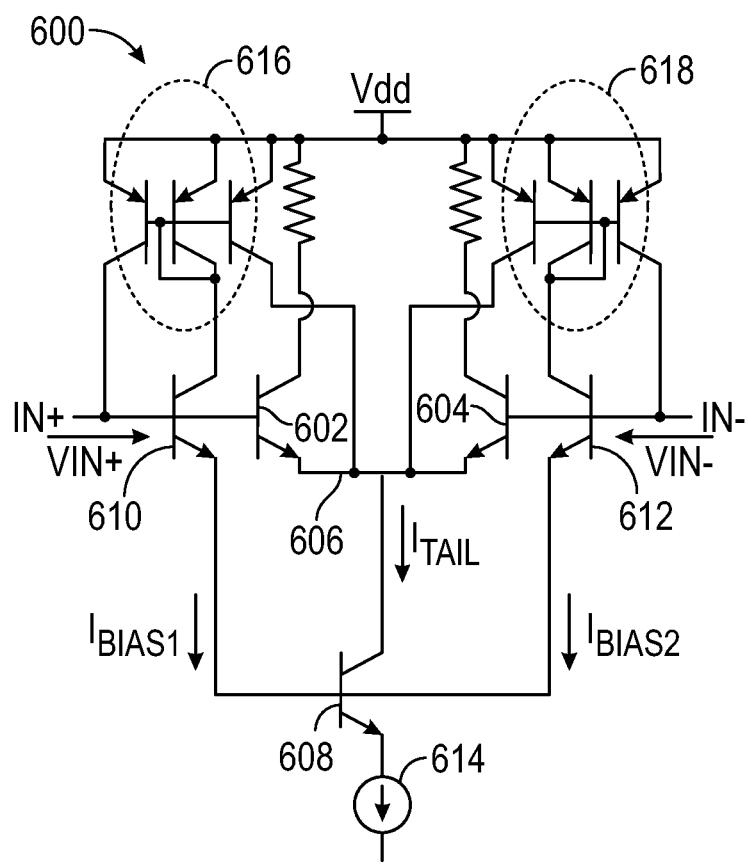
FIG. 6 is another example of a circuit that can provide transient cancellation using various techniques of this disclosure.

FIG. 6 is another example of a circuit that can provide transient cancellation using various techniques of this disclosure. If the β is not large enough that the $$\frac{1}{\beta^2}$$

error term of FIG. 3 can be ignored, a further improvement can be achieved with the circuit 600 of FIG. 6, which can slightly adjust the main tail current to compensate.

The circuit 600 includes a resistively-loaded first differential transistor pair having a first input transistor 602 configured to receive a first input signal VIN+ at a first input node IN+ and a second input transistor 604 configured to receive a second input signal VIN− at a second input node IN−. An emitter of the first input transistor 602 is coupled to an emitter of the second input transistor 604 at node 606.

The circuit 600 includes a cancellation circuit configured to reduce or cancel a variation in corresponding input bias current received at the first and second input nodes IN+, IN− due to input transient voltages. The cancellation circuit can include a cascode transistor circuit including a cascode transistor 608 configured to provide a tail current $I_{TAIL}$ of the first differential transistor pair. Moving the cascode transistor 608 into the tail current path and out of the collectors of the main transistors 602, 604 (like in FIG. 2), can restore the ability of the first (or main) differential transistor pair to operate as close to the voltage supply rail VDD as possible.

The cancellation circuit can further include a second differential transistor pair including a third transistor 610 and a fourth transistor 612. The circuit 600 achieves transient tracking by inserting the cascode transistor 608 in the tail current path, and then splitting its base current using the replica differential transistor pair 610, 612, which duplicates the hyperbolic tangent function tanh( ) of the main differential transistor pair 602, 604.

The third transistor 610 and the fourth transistor 612 are configured to receive representations of the first and second input signals VIN+, VIN−, respectively. In addition, the third transistor 610 and the fourth transistor 612 are configured to split a bias current of the cascode transistor 608 into two currents $I_{BIAS1}$ and $I_{BIAS2}$, according to the received representations of the first and second input signals VIN+, VIN−. The cancellation circuit is configured to provide currents corresponding to the two currents $I_{BIAS1}$ and $I_{BIAS2}$ to the first and second input nodes IN+, IN−.

In some examples, the cascode transistor 608 includes a collector coupled to the emitters of the first and second input transistors 602, 604. A base of the third transistor 610 can be coupled to a base of the first input transistor 602, and a base of the fourth transistor 612 can be coupled to a base of the second input transistor 604. An emitter of the third transistor 610 can be coupled to a base of the cascode transistor 608, and an emitter of the fourth transistor 612 can be coupled to the base of the cascode transistor 608. The circuit 600 can include a current source 614 coupled to at least one emitter of the cascode transistor circuit, such as the emitter of the cascode transistor 608.

In some examples, the circuit 600 can include a first current mirror circuit 616 coupled to a collector of the third transistor 610 and a second current mirror circuit 618 coupled to a collector of the fourth transistor 612. As such, the replica collectors are mirrored, giving near-zero total input bias current, regardless of voltage. The circuit 600 also suppresses "balanced" input current noise, which is due to the noise of the tail current. The first current mirror circuit 616 and the second current mirror circuit 618 can provide the currents corresponding to the two currents $I_{BIAS1}$ and $I_{BIAS2}$ to the first and second input nodes IN+, IN−. In this manner, the base currents of the transistors 602, 604 can be subtracted at the input nodes IN+, IN−.

A $$\frac{1}{\beta^2}$$

error can occur because the operating currents of the transistors 602, 604 are not half of the operating current of the transistors 610, 612. To overcome this error, the first current mirror circuit 616 and the second current mirror circuit 618 can be multiple-output current mirror circuits, where an output of the first current mirror circuit 616 can be coupled to the emitters of the first and second input transistors 602, 604, and an output of the second current mirror circuit 618 can be coupled to the emitters of the first and second input transistors 602, 604, such as shown in FIG. 6. Such a configuration feeds a correction current into the tail current $I_{TAIL}$, which adjusts for the $$\frac{1}{\beta^2}$$

error. The configuration adjusts the operating point of the transistors 602, 604 of the main differential transistor pair so that their current is the correct current to be corrected by the rest of the circuit 600.

Although the current mirror circuits 616, 618 are shown as PNP BJT transistors in FIG. 6 (and in FIG. 3), in some examples, these current mirror circuits can include field effect transistors. For example, the first current mirror circuit 616 can include field-effect transistors, and the second current mirror circuit 618 can include field-effect transistors.

The circuit 600 of FIG. 6 exploits the fact that the current splitting that occurs in the main differential transistor pair 602, 604 is a predictable, known hyperbolic tangent function of the input voltage. The second differential transistor pair including the third transistor 610 and the fourth transistor 612 provides the current splitting but operates on the base current. Because the base current is related to the collector current ($I_C=\beta I_B$), the hyperbolic tangent function can be applied either before or after the current gets split.

In the circuit 200 of FIG. 2, the main differential transistor pair 202, 204 splits the current and then the circuit determines the base current using a replica transistor. In contrast, the circuit 600 does not split the current. Instead, the base current division is performed immediately and then the hyperbolic tangent function is applied afterward.

In examples shown in FIGS. 3, 4, and 6, the first and second input transistors are NPN bipolar junction transistors, the third and fourth transistors are NPN bipolar junction transistors, and the cascode transistor is an NPN bipolar junction transistor. In some examples, the first and second input transistors are PNP bipolar junction transistors, the third and fourth transistors are PNP bipolar junction transistors, and the cascode transistor is a PNP bipolar junction transistor. In addition, although shown as resistively-loaded circuits described in this disclosure can use active loads, for example.

In some examples, it can be desirable to use a more complex splitting structure if the main path through the first differential transistor pair uses, for example, a multi-tank structure. The splitting can also be accomplished by having two cascode transistors whose bases are individually biased to track the inputs, such as shown in FIG. 7.

Figure 7:
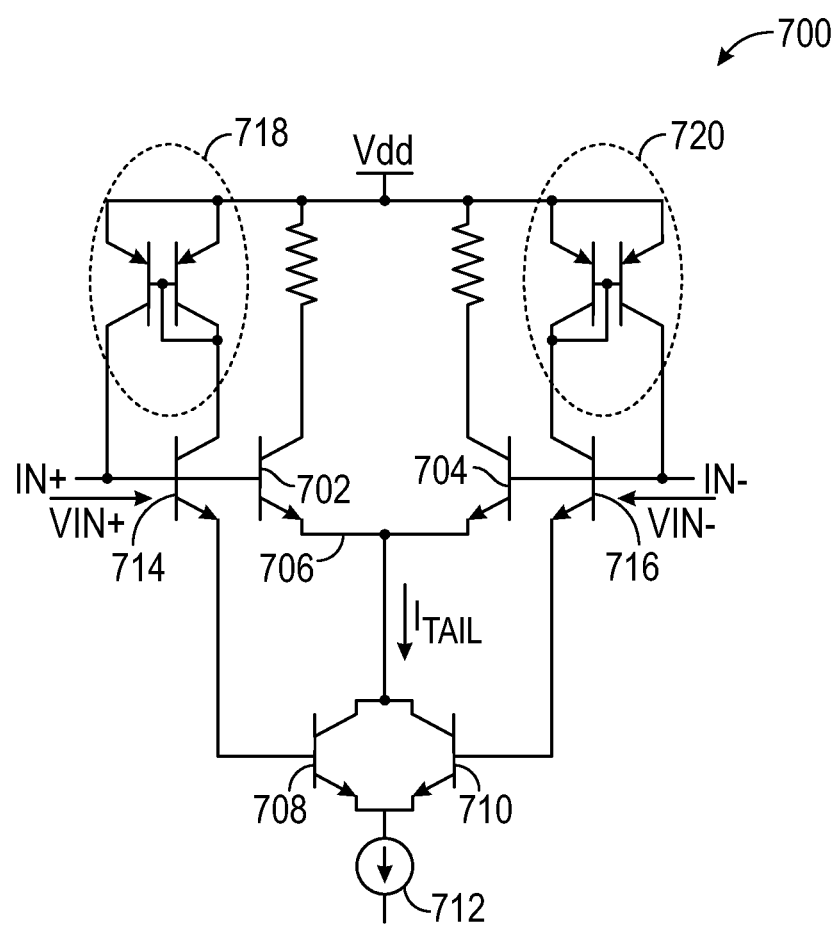
FIG. 7 is another example of a circuit that can provide transient cancellation using various techniques of this disclosure.

FIG. 7 is another example of a circuit that can provide transient cancellation using various techniques of this disclosure. The circuit 700 includes a resistively-loaded first differential transistor pair having a first input transistor 702 configured to receive a first input signal VIN+ at a first input node IN+ and a second input transistor 704 configured to receive a second input signal VIN− at a second input node IN−. An emitter of the first input transistor 702 is coupled to an emitter of the second input transistor 704 at node 706.

The circuit 700 includes a cancellation circuit configured to reduce or cancel a variation in corresponding input bias current received at the first and second input nodes IN+, IN− due to input transient voltages. The cascode transistor circuit can include a cascode second transistor pair including a third transistor 708 and a fourth transistor 710 configured to provide at least a portion of a tail current $I_{TAIL}$ of the first differential transistor pair. The cancellation circuit is configured to provide currents corresponding to the two currents to the first and second input nodes IN+, IN−. A current source 712 can be coupled to the emitters of the third and fourth transistors 708, 710.

The third and fourth transistors 708, 710 are configured to split the tail current $I_{TAIL}$ into two currents. That is, instead of splitting the bias current, as in the configurations described above, the third and fourth transistors 708, 710 of the cascode transistor pair split the tail current $I_{TAIL}$ and then sum it back together.

The cancellation circuit can further include buffer circuitry configured to receive the first and second input signals VIN+, VIN− and to provide representations of the first and second input signals VIN+, VIN− to the third and fourth transistors 708, 710. The buffer circuitry can provide buffering and/or a level shifting function to the circuit 700. In some examples, the buffer circuitry can include a fifth transistor 714 and a sixth transistor 716, where the fifth and sixth transistors 714, 716 are configured to receive the first and second input signals VIN+, VIN−, respectively. The fifth and sixth transistors 714, 716 provide the input voltages to the corresponding bases of the third and fourth transistors 708, 710.

In some examples, a base of the fifth transistor 714 and a base of the sixth transistor 716 are coupled to corresponding bases of the first and second input transistors 702, 704.

In FIG. 7, instead of using the fifth and sixth transistors 714, 716 to split the tail current, the cascode transistor pair 708, 710 splits the tail current into two currents. That is, the cascode transistor pair performs the tanh( ) splitting and the fifth and sixth transistors 714, 716 provide a representation of the first and second input signals VIN+, VIN− to the third and fourth transistors 708, 710 of the cascode transistor pair. The cascode transistor pair are fed with essentially the same current as the first and second input transistors 702, 704 and they have the same differential voltage applied across them as the first and second input transistors 702, 704. The base currents of the third and fourth transistors 708, 710 of the cascode transistor pair reflect any changes in the input bias current due to transient voltages because the buffer circuitry applies those same transient voltages to the third and fourth transistors 708, 710.

In some examples, the circuit 700 can include a first current mirror circuit 718 coupled to a collector of the fifth transistor 714 and a second current mirror circuit 720 coupled to a collector of the sixth transistor 716. The base currents of the corresponding third and fourth transistors 708, 710 of the cascode transistor pair reflect the changes in the input bias current to the first and second input transistors 702, 704 due to the transients. Any changes to these base currents cause a change in the collector currents in the corresponding fifth and sixth transistors 714, 716, which is then mirrored through the corresponding current mirror circuit and applied to the first and second input nodes IN+, IN− to provide the desired cancellation.

Although the current mirror circuits 718, 720 are shown as PNP BJT transistors in FIG. 7, in some examples, these current mirror circuits can include field effect transistors. For example, the first current mirror circuit 718 can include field-effect transistors, and the second current mirror circuit 720 can include field-effect transistors.

Figure 8:
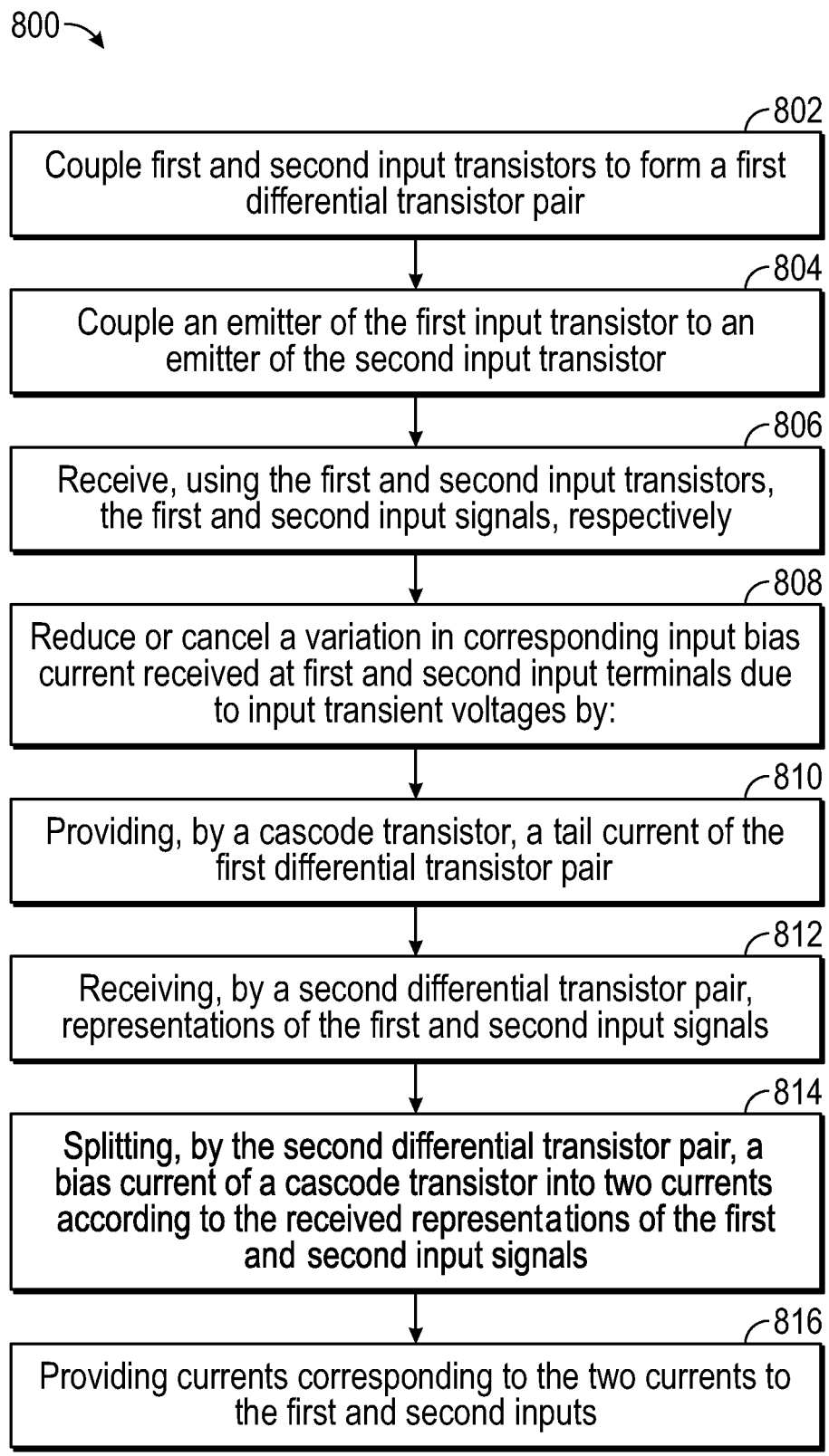
FIG. 8 is a flowchart of an example of a method compensating a circuit, the circuit having first and second inputs to receive corresponding first and second input signals.

FIG. 8 is a flowchart of an example of a method compensating a circuit, the circuit having first and second inputs to receive corresponding first and second input signals. The method 800 is represented as a set of blocks 802-808 that describe operations of the method.

At operation 802, the method 800 can include coupling first and second input transistors to form a first differential transistor pair. For example, in FIG. 3, the first and second input transistors 302, 304 can be coupled to form a first differential transistor pair.

At operation 804, the method 800 can include coupling an emitter of the first input transistor to an emitter of the second input transistor. For example, in FIG. 3, an emitter of the first input transistor 302 can be coupled to an emitter of the second input transistor 304.

At operation 806, the method 800 can include receiving, using the first and second input transistors, the first and second input signals, respectively. For example, in FIG. 3, the first and second input transistors can receive the first and second input signals VIN+ and VIN−, respectively.

At operation 808, the method 800 can include reducing or canceling a variation in corresponding input bias current received at first and second input nodes due to input transient voltages by performing various acts at operations 810-816.

At operation 810, the method 800 can include providing, by a cascode transistor, a tail current of the first differential transistor pair. For example, in FIG. 3, the cascode transistor 308 can provide a tail current of the first differential transistor pair.

At operation 812, the method 800 can include receiving, by a second differential transistor pair, representations of the first and second input signals. For example, a second differential transistor pair, such as including the third transistor 310 and the fourth transistor 312 of FIG. 3, can receive representations of the first and second input signals VIN+, VIN−.

At operation 814, the method 800 can include splitting, by the second differential transistor pair, a bias current of a cascode transistor into two currents according to the received representations of the first and second input signals. For example, a second differential transistor pair, such as including the third transistor 310 and the fourth transistor 312 of FIG. 3, can split a bias current of a cascode transistor 308 into two currents according to the received representations of the first and second input signals.

At operation 816, the method 800 can include providing currents corresponding to the two currents to the first and second inputs. For example, the circuit 300 of FIG. 3, for example, can provide currents corresponding to the two currents to the first and second input nodes, such as by using the first current mirror circuit 316 and the second current mirror circuit 318.

Each of the non-limiting aspects or examples described herein may stand on its own or may be combined in various permutations or combinations with one or more of the other examples.

The above detailed description includes references to the accompanying drawings, which form a part of the detailed description. The drawings show, by way of illustration, specific embodiments in which the invention may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." tri this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein may be machine or computer-implemented at least in part. Some examples may include a computer-readable medium or machine-readable medium encoded with instructions operable to configure an electronic device to perform methods as described in the above examples. An implementation of such methods may include code, such as microcode, assembly language code, a higher-level language code, or the like. Such code may include computer readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, but are not limited to, hard disks, removable magnetic disks, removable optical disks (e.g., compact discs and digital video discs), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments may be combined with each other in various combinations or permutations. The scope of the invention should be determined with reference to the appended claims, along with the full scope of equivalents to which such claims are entitled.

The claimed invention is:

1. A circuit having first and second input terminals to receive corresponding first and second input signals, the circuit comprising:
 a first differential transistor pair including first and second input transistors, wherein the first and second input transistors are configured to receive the first and second input signals, respectively, and wherein an emitter of the first input transistor is coupled to an emitter of the second input transistor; and
 a cancellation circuit configured to reduce or cancel a variation in corresponding input bias current received at the first and second input terminals due to input transient voltages, the cancellation circuit comprising:
a cascode transistor circuit including a cascode transistor configured to provide a tail current of the first differential transistor pair; and
a second differential transistor pair including third and fourth transistors, wherein the third and fourth transistors are configured to:
receive representations of the first and second input signals; and
split a bias current of the cascode transistor into two currents according to the received representations of the first and second input signals,
wherein the cancellation circuit is configured to provide currents corresponding to the two currents to the first and second input terminals.

2. The circuit of claim 1, wherein the cascode transistor includes a collector coupled to emitters of the first and second input transistors;
wherein a base of the third transistor is coupled to a base of the first input transistor, wherein a base of the fourth transistor is coupled to a base of the second input transistor, wherein an emitter of the third transistor is coupled to a base of the cascode transistor, and wherein an emitter of the fourth transistor is coupled to the base of the cascode transistor, the circuit further comprising:
a current source coupled to at least one emitter of the cascode transistor circuit.

3. The circuit of claim 1, wherein a collector of the third transistor is coupled to the second input, and wherein a collector of the fourth transistor is coupled to the first input.

4. The circuit of claim 1, comprising:
a first current mirror circuit coupled to a collector of the third transistor; and
a second current mirror circuit coupled to a collector of the fourth transistor,
wherein the first current mirror circuit and the second current mirror circuit provide the currents corresponding to the two currents to the first and second input terminals.

5. The circuit of claim 4, wherein an output of the first current mirror circuit is coupled to emitters of the first and second input transistors, and wherein an output of the second current mirror circuit is coupled to the emitters of the first and second input transistors.

6. The circuit of claim 5, wherein the first current mirror circuit includes field-effect transistors, and wherein the second current mirror circuit includes field-effect transistors.

7. The circuit of claim 1, wherein the first and second input transistors include NPN bipolar junction transistors, wherein the third and fourth transistors include NPN bipolar junction transistors, and wherein the cascode transistor is an NPN bipolar junction transistor.

8. A method of compensating a circuit, the circuit having first and second input terminals to receive corresponding first and second input signals, the method comprising:
coupling first and second input transistors to form a first differential transistor pair;
coupling an emitter of the first input transistor to an emitter of the second input transistor;
receiving, using the first and second input transistors, the first and second input signals, respectively; and
reducing or canceling a variation in corresponding input bias current received at the first and second input terminals due to input transient voltages by:
providing, by a cascode transistor, a tail current of the first differential transistor pair;
receiving, by a second differential transistor pair, representations of the first and second input signals;
splitting, by the second differential transistor pair, a bias current of a cascode transistor into two currents according to the received representations of the first and second input signals; and
providing currents corresponding to the two currents to the first and second input terminals.

9. The method of claim 8, wherein the second differential transistor pair includes third and fourth transistors, and wherein the cascode transistor includes a collector coupled to emitters of the first and second input transistors, the method comprising:
coupling a base of the third transistor to a base of the first input transistor;
coupling a base of the fourth transistor to a base of the second input transistor;
coupling an emitter of the third transistor to a base of the cascode transistor;
coupling an emitter of the fourth transistor to the base of the cascode transistor; and
coupling a current source to at least one emitter of the cascode transistor circuit.

10. The method of claim 8, wherein the second differential transistor pair includes third and fourth transistors, the method comprising:
coupling a collector of the third transistor to the second input; and
coupling a collector of the fourth transistor to the first input.

11. The method of claim 8, wherein the second differential transistor pair includes third and fourth transistors, the method comprising:
coupling a first current mirror circuit to a collector of the third transistor; and
coupling a second current mirror circuit to a collector of the fourth transistor;
wherein the first current mirror circuit and the second current mirror circuit provide the currents corresponding to the two currents to the first and second input terminals.

12. The method of claim 11, comprising:
coupling an output of the first current mirror circuit to emitters of the first and second input transistors; and
coupling an output of the second current mirror circuit to the emitters of the first and second input transistors.

13. The method of claim 11, wherein the first current mirror circuit includes field-effect transistors, and wherein the second current mirror circuit includes field-effect transistors.

14. The method of claim 8, wherein the second differential transistor pair includes third and fourth transistors, wherein the first and second input transistors are NPN bipolar junction transistors, wherein the third and fourth transistors are NPN bipolar junction transistors, and wherein the cascode transistor is an NPN bipolar junction transistor.

15. A circuit having first and second input terminals to receive corresponding first and second input signals, the circuit comprising:
a first differential transistor pair including first and second input transistors, wherein the first and second input transistors are configured to receive the first and second input signals, respectively, and wherein an emitter of the first input transistor is coupled to an emitter of the second input transistor; and
a cancellation circuit configured to reduce or cancel a variation in corresponding input bias current received at first and second input input terminals due to input transient voltages, the cancellation circuit comprising:

a cascode transistor circuit including a cascode second transistor pair including third and fourth transistors configured to provide at least a portion of a tail current of the first differential transistor pair, wherein the third and fourth transistors are configured to split the tail current into two currents; and buffer circuitry configured to receive the first and second input signals, and wherein the buffer circuitry is configured to provide representations of the first and second input signals to the third and fourth transistors, wherein the cancellation circuit is configured to provide currents corresponding to the two currents to the first and second input terminals.

16. The circuit of claim 15, wherein the buffer circuitry is configured to receive corresponding base currents of the third and fourth transistors.

17. The circuit of claim 15, comprising:

current mirror circuitry coupled to the buffer circuitry, wherein the current mirror circuitry is configured to provide the currents corresponding to the two currents to the first and second input terminals.

18. The circuit of claim 17, wherein the current mirror circuitry includes field-effect transistors.

19. The circuit of claim 15, wherein the buffer circuitry comprises:

fifth and sixth transistors, wherein the fifth and sixth transistors are configured to receive the first and second input signals, respectively.

20. The circuit of claim 19, wherein a base of the fifth transistor and a base of the sixth transistor are coupled to corresponding bases of the first and second input transistors.

* * * * *